(12) United States Patent
Eib et al.

(10) Patent No.: US 7,372,547 B2
(45) Date of Patent: May 13, 2008

(54) PROCESS AND APPARATUS FOR ACHIEVING SINGLE EXPOSURE PATTERN TRANSFER USING MASKLESS OPTICAL DIRECT WRITE LITHOGRAPHY

(75) Inventors: Nicholas K. Eib, San Jose, CA (US);
Ebo H. Croffie, Portland, OR (US);
Neal P. Callan, Lake Oswego, OR (US)

(73) Assignee: LSI Corporation, Milpitas, CA (US)

( * ) Notice: Subject to any disclaimer, the term of this patent is extended or adjusted under 35 U.S.C. 154(b) by 217 days.

(21) Appl. No.: 11/012,003

(22) Filed: Dec. 14, 2004

(65) Prior Publication Data

US 2005/0237508 A1 Oct. 27, 2005

Related U.S. Application Data

(60) Provisional application No. 60/565,921, filed on Apr. 27, 2004.

(51) Int. Cl.
*G03B 27/74* (2006.01)
*G03B 27/42* (2006.01)
*G03B 27/72* (2006.01)
*G03B 27/32* (2006.01)
*G02B 26/00* (2006.01)

(52) U.S. Cl. ............................ 355/67; 355/53; 355/71; 355/77; 359/292

(58) Field of Classification Search .................. 355/53, 355/67, 71, 77; 359/224, 290, 291, 292; 430/322
See application file for complete search history.

(56) References Cited

U.S. PATENT DOCUMENTS 5,691,541 A * 11/1997 Ceglio et al. ............ 250/492.1

(Continued)

OTHER PUBLICATIONS

Yashesh Shroff et al., "Optical Analysis of Mirror Based Pattern Generation", Proceedings of SPIE, vol. 5037 (2003), pp. 550-559.

(Continued)

*Primary Examiner*—Alan Mathews
(74) *Attorney, Agent, or Firm*—Beyer Weaver LLP

(57) ABSTRACT

The present invention provides methods and apparatus for accomplishing a phase shift lithography process using a off axis light to reduce the effect of zero order light to improve the process window for maskless phase shift lithography systems and methodologies. A lithography system is provided. The lithography system provided uses off axis light beams projected onto a mirror array configured to generate a phase shift optical image pattern. This pattern is projected onto a photoimageable layer formed on the target substrate to facilitate pattern transfer.

41 Claims, 8 Drawing Sheets

U.S. PATENT DOCUMENTS

| | | | |
|---|---|---|---|
| 5,986,740 A * | 11/1999 | Robinson et al. | 349/201 |
| 6,060,224 A * | 5/2000 | Sweatt et al. | 430/395 |
| 6,133,986 A * | 10/2000 | Johnson | 355/67 |
| 6,251,550 B1 | 6/2001 | Ishikawa | 430/22 |
| 6,301,000 B1 * | 10/2001 | Johnson | 355/67 |
| 6,717,650 B2 * | 4/2004 | Jain | 355/53 |
| 6,930,754 B1 * | 8/2005 | Sugita et al. | 355/53 |
| 6,958,804 B2 * | 10/2005 | Wieland et al. | 355/67 |
| 6,963,434 B1 * | 11/2005 | Latypov | 359/237 |
| 2002/0159044 A1 * | 10/2002 | Mei et al. | 355/67 |
| 2002/0171816 A1 * | 11/2002 | Markle | 355/67 |
| 2003/0007134 A1 * | 1/2003 | Maximus | 353/31 |
| 2003/0128347 A1 * | 7/2003 | Case et al. | 355/53 |
| 2003/0156269 A1 * | 8/2003 | Komatsuda et al. | 355/71 |
| 2003/0190535 A1 * | 10/2003 | Fries | 430/22 |
| 2003/0202233 A1 * | 10/2003 | Sandstrom | 359/290 |
| 2003/0210383 A1 * | 11/2003 | Bjorklund et al. | 355/53 |
| 2004/0053143 A1 * | 3/2004 | Sandstrom | 430/5 |
| 2004/0207829 A1 * | 10/2004 | Hansen et al. | 355/67 |
| 2005/0041229 A1 * | 2/2005 | Meisburger | 355/53 |

OTHER PUBLICATIONS

U.S. Appl. No. 10/825,342, entitled: "Optimized Mirror Design for Optical Direct Write", by inventors Nicholas Eib et al., filed April 14, 2004.

U.S. Appl. No. 10/988,087, entitled: "Process and Apparatus for Applying Apodization to Maskless Optical Direct Write Lithography Processes", by inventors Nicholas K. Eib et al., filed Nov. 12, 2004.

U.S. Appl. No. 10/993,603, entitled: "Process and Apparatus for Generating a Strong Phase Shift Optical Pattern for Use in an Optical Direct Write Lithography Process", by inventors Nicholas K. Eib et al., filed Nov. 19, 2004.

* cited by examiner

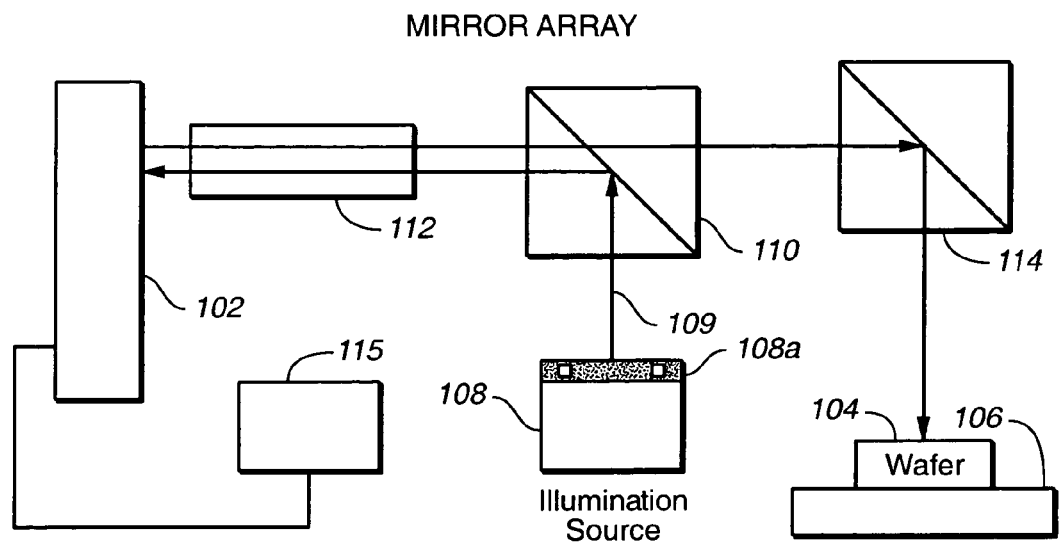
*FIG._1a*
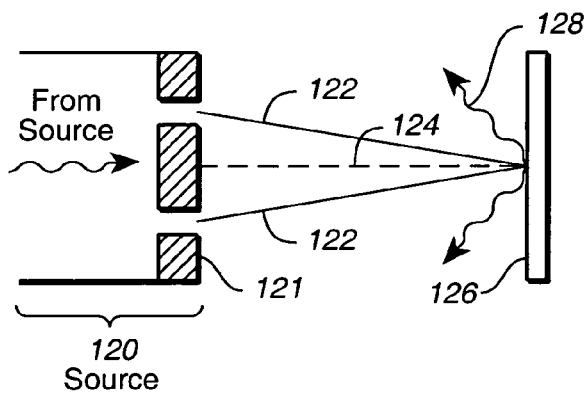
*FIG._1b*
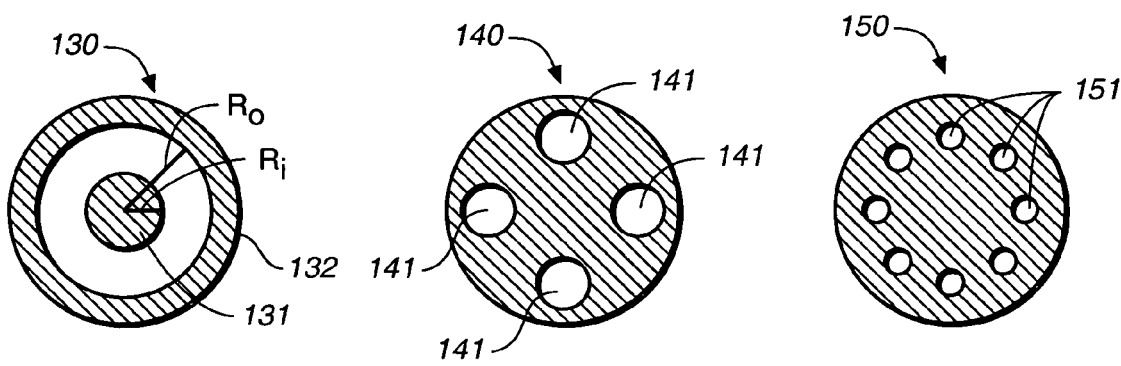
*FIG._1c*  *FIG._1d*  *FIG._1e*

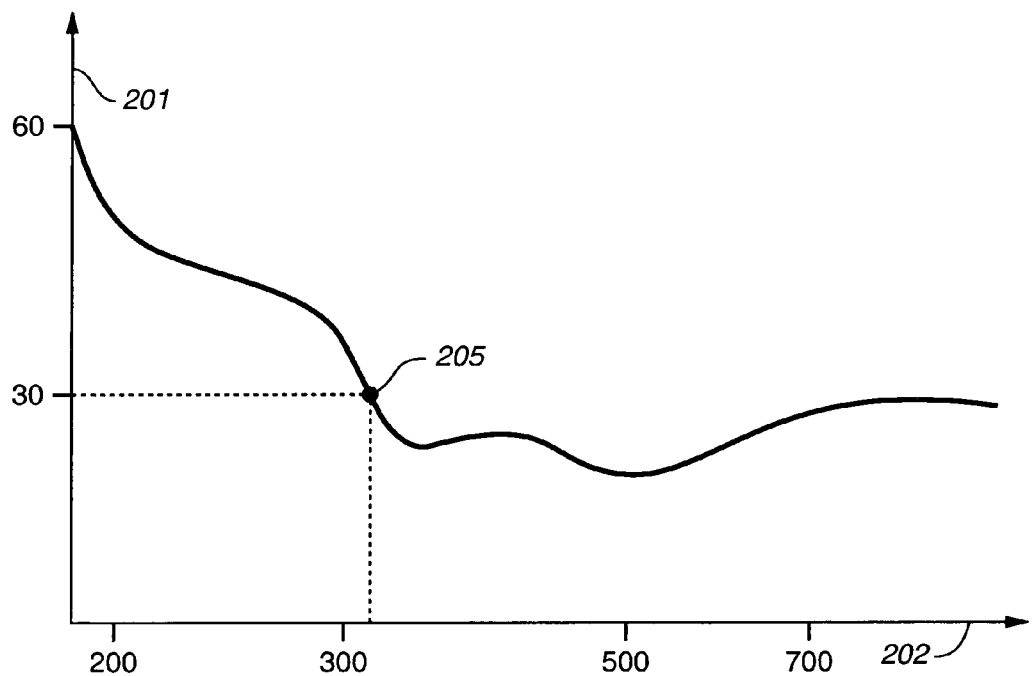
FIG._2
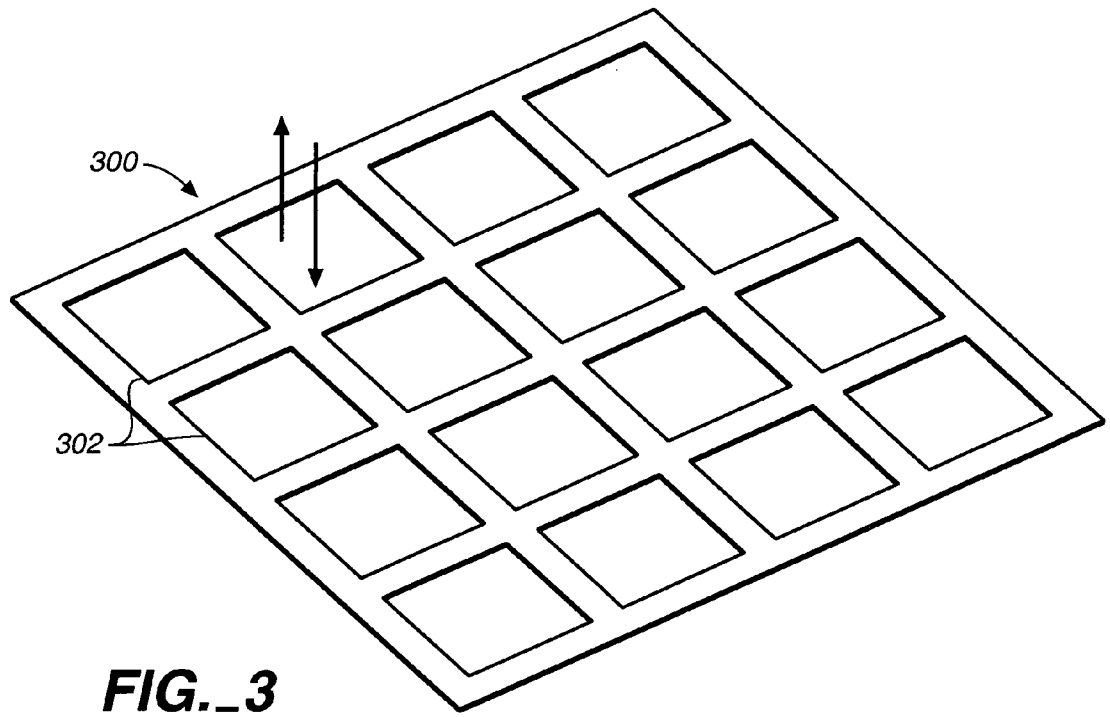
FIG._3

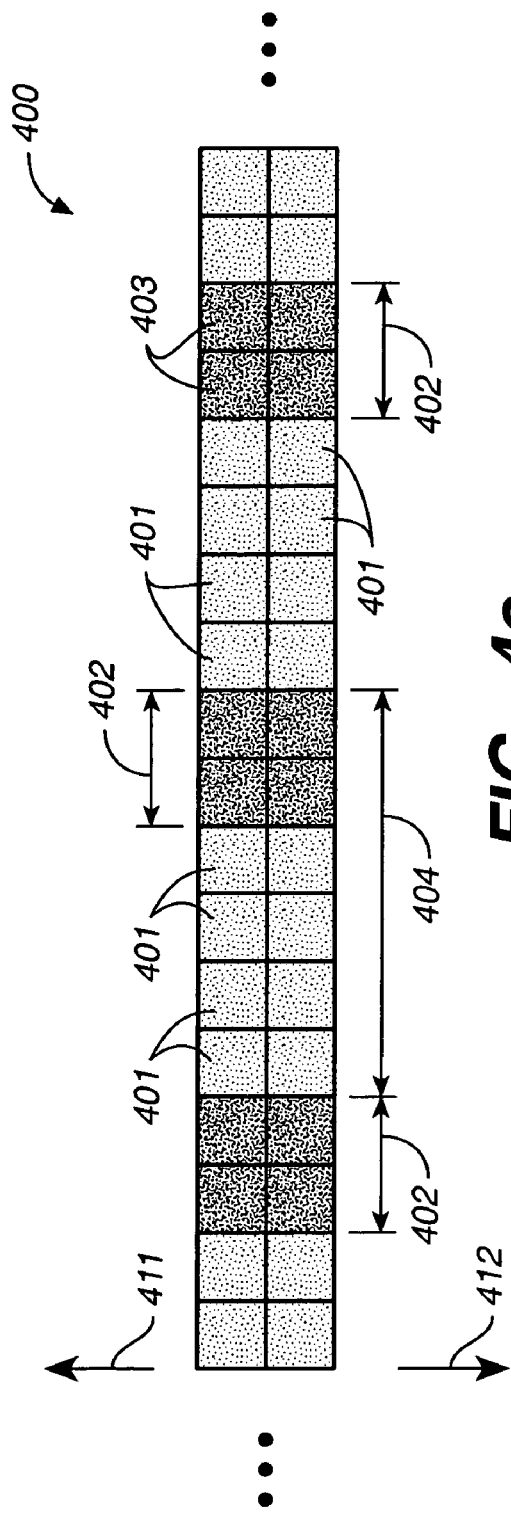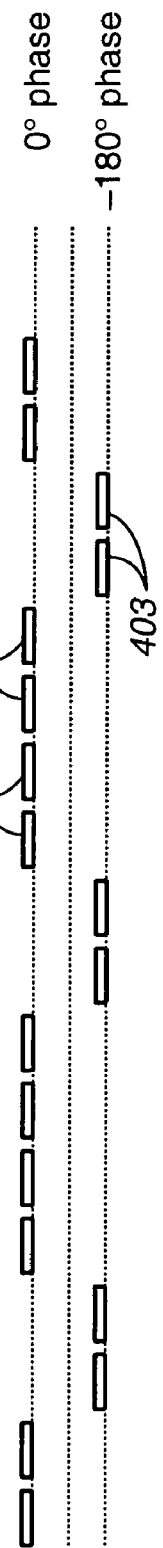
FIG._4a
FIG._4b

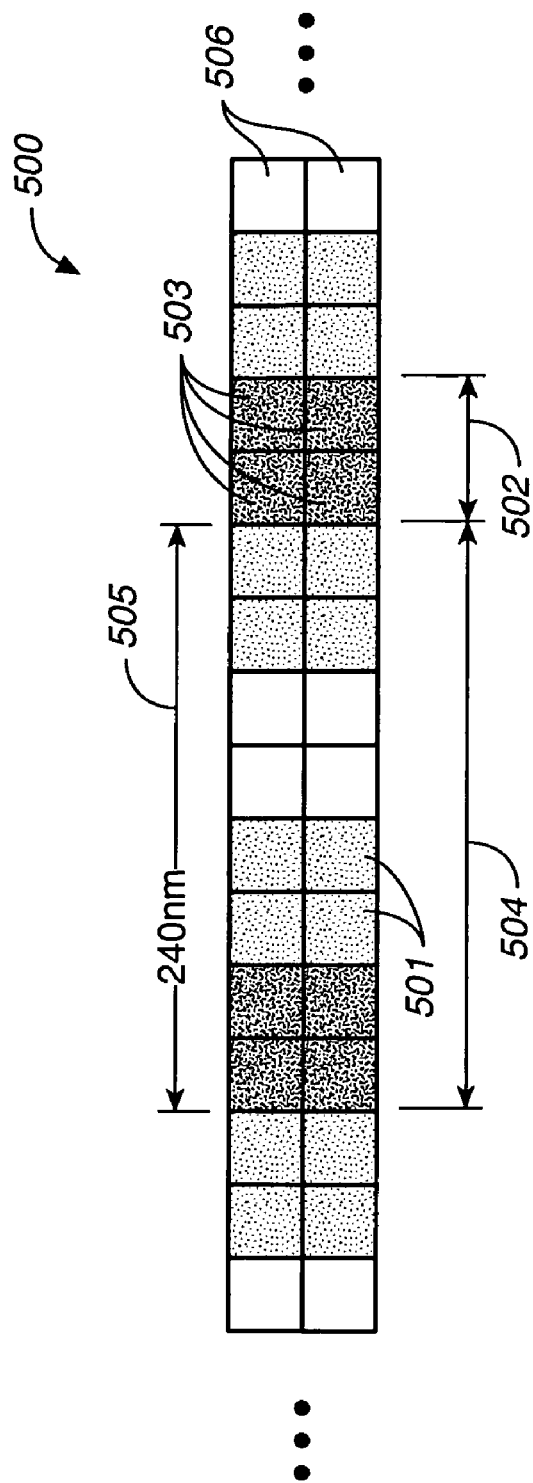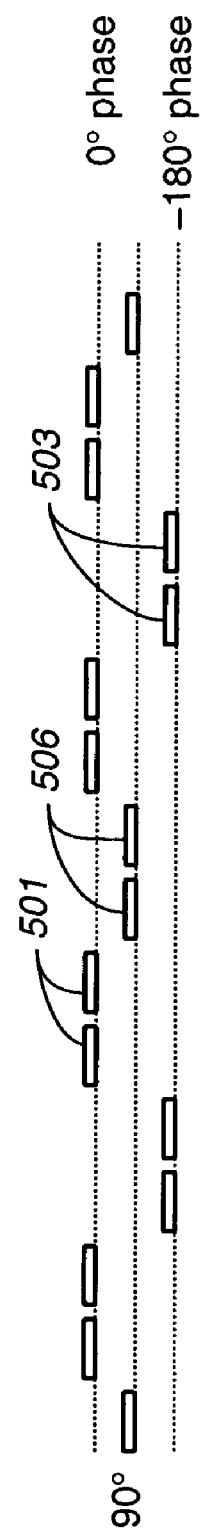
FIG._5a
FIG._5b

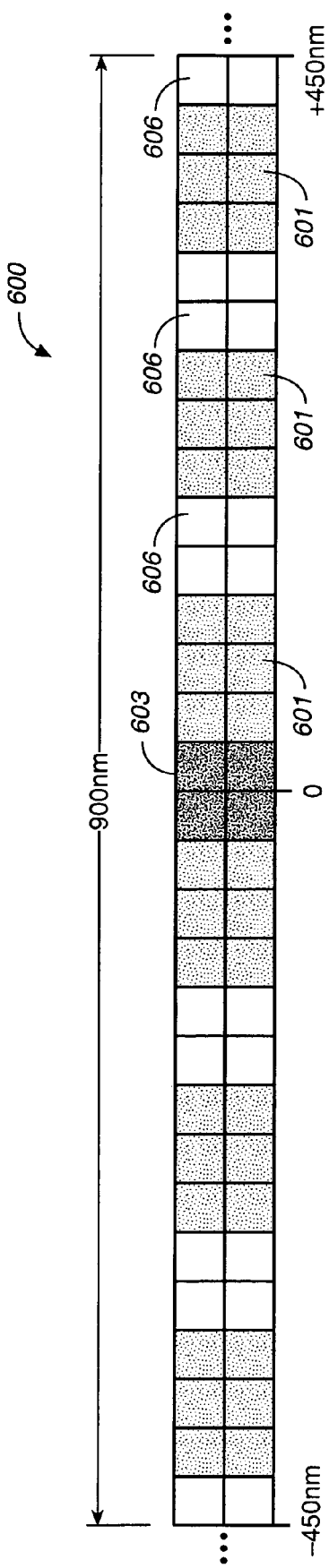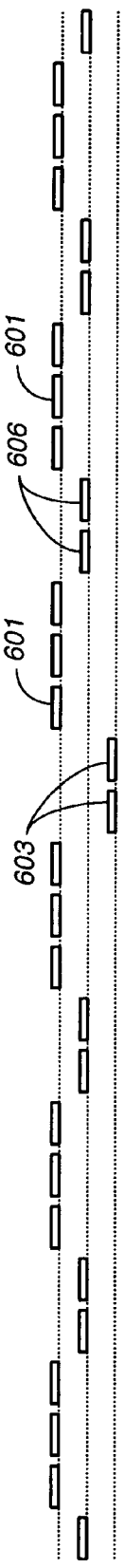
FIG._6a
FIG._6b

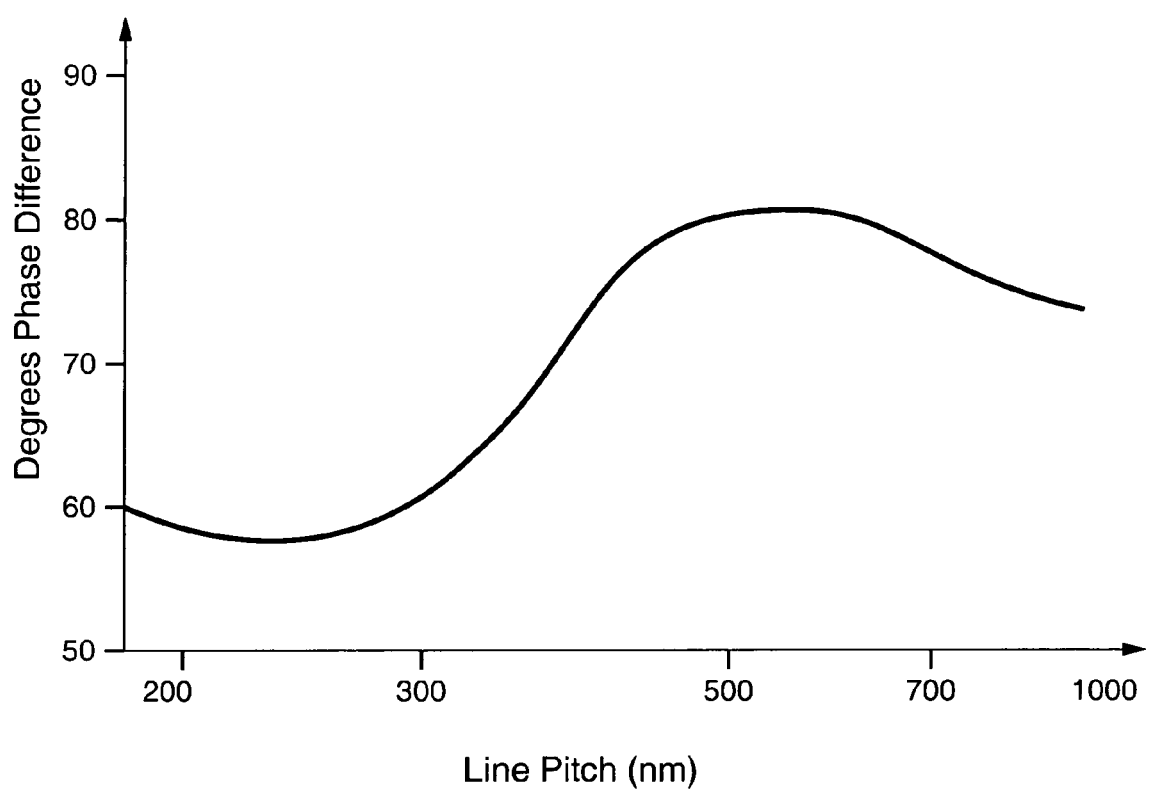
FIG._7

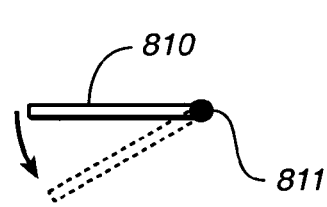
FIG._8a
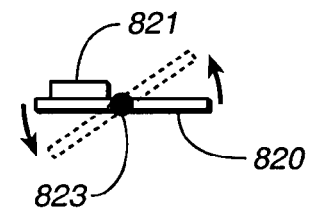
FIG._8b
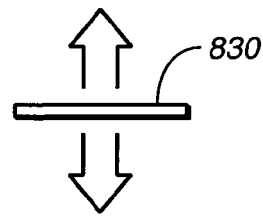
FIG._8c
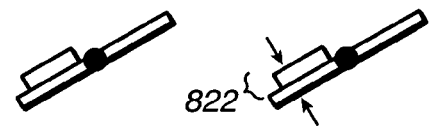
FIG._8d
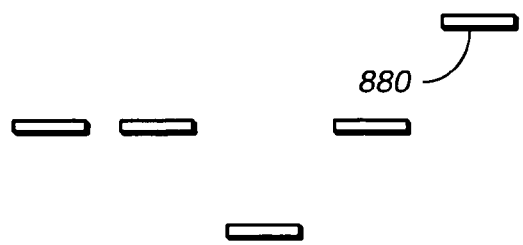
FIG._8e
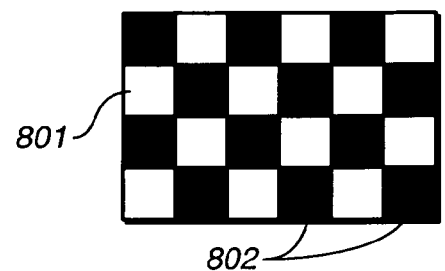
FIG._8f

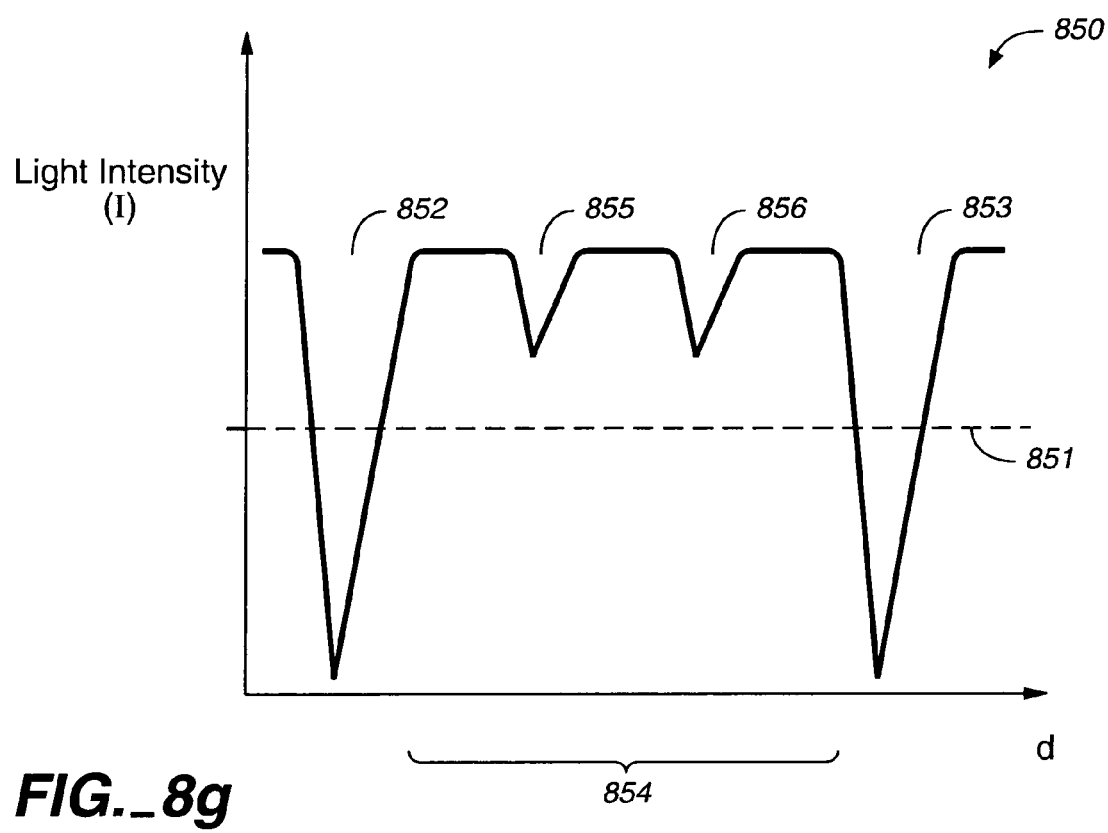
FIG._8g
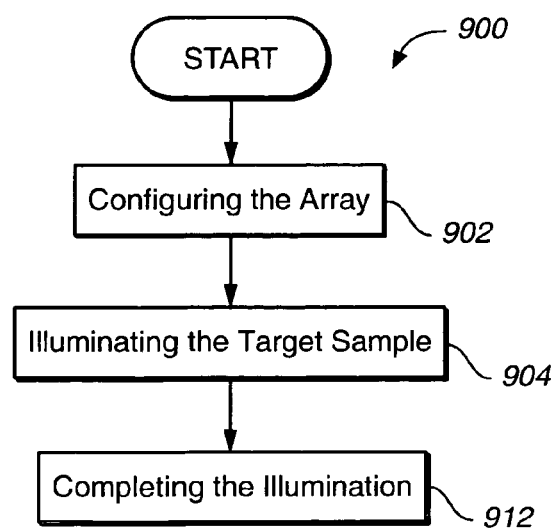
FIG._9

PROCESS AND APPARATUS FOR ACHIEVING SINGLE EXPOSURE PATTERN TRANSFER USING MASKLESS OPTICAL DIRECT WRITE LITHOGRAPHY

CROSS-REFERENCE TO RELATED APPLICATIONS

This application claims priority of U.S. Provisional Patent Application No. 60/565,921, filed 27 Apr. 2004, which is incorporated herein by reference in its entirety for all purposes.

This application is also related to the U.S. Utility patent application Ser. No. 10/993,603, filed on 19 Nov. 2004, entitled: "Process And Apparatus For Generating A Strong Phase Shift Optical Pattern For Use In An Optical Direct Write Lithography Process" which application is incorporated herein by reference in its entirety for all purposes.

This application is also related to the U.S. Utility patent application Ser. No. 10/988,087, filed on 12 Nov. 2004, entitled: "Process And Apparatus For Applying Apodization to Maskless Optical Direct Write Lithography Process" which application is incorporated herein by reference in its entirety for all purposes.

FIELD OF THE INVENTION

The present invention relates to methods and apparatus for forming semiconductor devices using maskless optical direct write systems and methods. More particularly, the present invention relates to methods and apparatus for using off-axis light to form optical phase shift patterns that are directed onto substrates to form substrate patterns.

BACKGROUND

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). To meet these requirements, semiconductor manufacturers are involved in a continuous process of building new fabrication lines at each new "next generation" process node (gate length). As the critical dimensions for these devices grow smaller, greater difficulties will be experienced in patterning these features using conventional photolithography.

Conventional photolithography methods used for pattern generation involve exposing a light sensitive photoresist layer to a light source. The light from the source is modulated using a reticle, typically a chrome-on-quartz mask reticle. During processing, reticle patterns are transferred to a photoresist layer formed on a semiconductor substrate. Commonly, such pattern transfer is achieved using visible or ultraviolet light. The exposed photoresist pattern is then developed to form a pattern of photoresist on the substrate. The developed regions are then washed away and the remaining photoresist pattern used to provide an etching mask for the substrate.

One newer approach to achieving the desired critical dimensions has been to use attenuated phase shift masks and strong phase shift masks. Such masks have many useful properties. However, such masks suffer from a number of shortcomings. Phase shifting masks are very difficult to produce; and unlike binary masks, are not readily reconfigurable. Additionally, conventional phase shifting masks commonly require two or more exposures per substrate layer to obtain a desired pattern. This has the effect of lowering throughput to perhaps 40% of that achievable with a single exposure approach.

An example of such a new process technology is embodied, for example, in optical direct write process techniques. One example of such a technique is taught, by the above-referenced inventors, in U.S. patent application Ser. No. 10/825,342, entitled: "Optimized Mirror Design for Optical Direct Write", filed on Apr. 14, 2004 and hereby incorporated by reference for all purposes.

An optical direct write system makes use of a programmable mirror array to generate photolithographically reproducible optical patterns that are projected onto a photoimageable layer. For example, an optical beam is directed onto the mirror array at an angle normal to the mirror array to produce an optical pattern. The optical pattern is then projected onto a substrate with a photoimageable layer. The reflected light pattern (i.e., reflected from the mirror array) exposes the photoimageable layer to transfer a desired pattern onto the substrate. Advantageously, the mirror array of the optical direct write system can be reconfigured by merely implementing software instructions to reconfigure the arrangement and orientation of the mirrors of the array.

In some implementations, mirror arrays are configured to generate phase shift exposure patterns. Typically, photolithographic optical settings (commonly including focus and dose, but not limited to such) and phase shifting mirror arrays are optimized for a process to produce the best process window for a given critical dimension. Commonly, a user/lithographer will optimize the process window for the smallest critical dimension to be found on the target substrate. Typically, this smallest critical dimension is associated with smallest feature desired or is associated with the smallest line pitch desired for a given process layer. The settings are optimized to generate a process window capable of faithfully reproducing the smallest feature with a desired degree of fidelity. When the settings are optimized in this way, they are generally excellent for reproducing dense line pitches or very small features. However, due to the nature of phase shift lithography, such optimized settings lose fidelity and sharpness when applied to other critical dimensions or significantly different line pitches. Thus, settings used to produce dense line pitches and small critical dimension (CD) features can be unsuitable for larger features. This is problematic because a typical semiconductor has a healthy mix of feature sizes and pitches. Thus, systems optimized for the worst case scenarios (small CD's and dense pitch patterns) are not optimized for larger features. This means that when systems optimized for dense patterns or short line pitches are used for less dense patterns unintended light scattering effects degrade the contrast and quality of the image pattern. For example, by creating periodic ghost patterns of alternating dark and light regions and causing drift in the width and position of features. Such systems must be re-optimized to image the larger features. This takes time and additional exposures and accordingly reduces throughput for the affected systems.

In view of the above difficulties, what is needed is a relatively simple and effective solution to such processing difficulties.

SUMMARY OF THE INVENTION

To achieve the foregoing, the present invention provides a lithography system configured to generate phase shift optical exposure patterns which are directed onto a substrate.

System embodiments include a light source capable of generating off axis light beams to improve the process window for image patterns projected onto the target substrate to facilitate an optical lithography process.

One embodiment of the invention involves a method of forming a pattern on a substrate. The method involves providing a mirror array comprising a plurality of movable mirrors and configuring the mirror array to generate a phase shift optical image pattern having a background pattern; a line pattern; and an assist feature pattern. A target substrate having formed thereon a photoimageable layer is provided. The mirror array is illuminated with off-axis light to generate a phase shift optical image pattern. The target substrate is exposed to the phase shift optical image pattern to transfer a desired exposure pattern onto the photoimageable layer.

In another embodiment, the invention comprises a maskless lithography system. The system includes a mirror array having a plurality of movable mirrors configurable to generate phase shift optical image patterns. The system includes an illumination source for directing off axis light beams onto the mirror array to form phase shift optical image patterns that are projecting onto a target substrate. The system includes a control element capable of configuring the mirrors to generate phase shift optical image patterns so that a phase shift optical image pattern thereby created has exposure features that include sub-resolution assist features.

These and other features and advantages of the present invention are described below with reference to the drawings.

BRIEF DESCRIPTION OF THE DRAWINGS

The following detailed description will be more readily understood in conjunction with the accompanying drawings, in which:

FIG. 1(a) is a simplified schematic diagram illustrating an embodiment of a maskless optical direct write lithography system constructed in accordance with the principles of the invention.

FIG. 1(b) is a more simplified schematic diagram illustrating a portion of an embodiment of a maskless optical direct write lithography system constructed in accordance with the principles of the invention.

FIGS. 1(c)-1(e) are schematic diagrams illustrating aperture embodiments suitable for use with a maskless optical direct write lithography system constructed in accordance with the principles of the invention.

FIG. 2 is a graph diagram illustrating an example of the amount of line width distortion caused by varying the line pitches for one embodiment of a maskless optical direct write lithography system constructed in accordance with the principles of the invention.

FIG. 3 is a simplified schematic diagram illustrating one embodiment of a mirror array suitable for use in a lithography system accordance with the principles of the invention.

FIGS. 4(a)-4(b), 5(a)-5(b), and 6(a)-6(b) are simplified plan views of portions of mirror arrays that schematically depict array configurations used to produce high quality phase shift patterns in a maskless optical direct write lithography process in accordance with the principles of the invention.

FIG. 7 is a graph diagram illustrating an example of the amount of phase adjustment used in assist features for various line pitches for one embodiment of a maskless optical direct write lithography system constructed in accordance with the principles of the invention.

FIG. 8(a)-8(g) are schematic depictions of various mirror embodiments and configurations implemented in a maskless optical direct write phase shift optical lithography system constructed in accordance with the principles of the invention.

FIG. 9 is a flow diagram illustrating operations in performing a maskless optical direct write phase shift optical lithography process to pattern a substrate in accordance with an embodiment of the present invention.

It is to be understood that in the drawings like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, methods and apparatus for implementing optical direct write lithography systems and processes are set forth. Such systems can employ maskless phase shift lithography processes using off-axis light to establish optical image patterns.

Maskless phase shift lithography as presently disclosed is a valuable patterning technique due to the ready reconfigurability of a programmable mirror array used to assist in pattern generation. Previously, maskless optical direct technologies using phase shift patterns required two or more separate exposures of the target substrate to effectively transfer a pattern to the target substrate. Some embodiments of the present invention can advantageously be used to transfer patterns to the target substrate using only a single exposure. Accordingly, throughput using such systems can be substantially increased, and in some embodiments throughput can be at least doubled.

The embodiments of the present invention utilize an off-axis light beam directed onto the mirror array of a maskless optical direct write system to generate a phase shift optical pattern which is directed onto a target substrate to achieve pattern transfer.

Embodiments of the invention are constructed to direct off-axis light onto a mirror array to produce phase shift optical patterns. The inventors have discovered that improved process windows can be achieved for phase shift optical lithography by incorporating this principle into a maskless phase shift optical direct write lithography system. For example, embodiments of the invention can be constructed to generate off-axis light beam(s) that are directed onto a mirror array that is configured to generate phase shift optical patterns. Off axis light beams are light beams directed onto the mirror array at an angle other than normal to the plane of the mirror array. Such configurations result in photolithographic processes having improved process windows. Such off axis illumination can be used to improve the process windows ordinarily obtained using normally illuminated alternating phase shift optical lithography (alt-PSM). By directing light onto the mirror array at a non-normal angle, substantially all zero order light is removed from the resulting optical signal. This is an extremely attractive attribute for a phase shift optical system.

Moreover, as the drive toward smaller and smaller critical dimensions (CD's) continues, phase shift optical lithography becomes even more attractive as a process technique. As feature sizes and CD's decrease, light diffracted by such features scatters at greater and greater scattering angles. Thus, systems having their process windows optimized for small CD's encounter certain difficulties when applied to features on the same surface having lower pitch densities or greater line pitch distances. The inventors have discovered that by offsetting the angle of incidence (directing the light onto the array at an angle other than normal) for an incident light beam, much improved (wider) process windows can be achieved.

Removing zero order light is attractive because such light is not generally useful for obtaining phase information. However, in accordance with some embodiments of the invention, by using off-axis light, the zero-order light (which does not include phase shift information) can be substantially reduced in the resultant reflected signal. The resulting phase shift optical signal (which is projected down onto a target surface) has a substantially higher portion of its signal having phase information. However, using such off axis light results in some difficulties. For example, when a line width of a certain line is patterned using off axis light, line widths can vary as the pitch (number of lines per a given unit length) varies, leading to distortions in the resulting line width. These distortions from the desired line widths are referred to generally as pattern drift or line width drift. This problem is particularly troublesome when optical settings optimized for tight (small or narrow) CD's are used to image looser pitches and larger feature sizes on the same layer. The inventors have discovered that by adding assist features in addition to off axis light, small CD's and short pitch features can be imaged along with looser pitches and larger feature sizes.

FIG. 1(a) is a simplified schematic diagram illustrating one embodiment of an optical direct write system configured in accordance with an embodiment of the present invention. The system 100 uses an illumination source 108 to generate an off axis light 109 that is projected onto a mirror array 102. In one implementation the source 108 includes an aperture 108a. Thus, light generated by the source 108 passes through the aperture 108a which generates off-axis light beams 109 that are directed into a beamsplitter 110 and through an optical system 112. After passing through optical system 112, the off-axis light beams 109 are directed onto a mirror array 102. The mirror array 102 is configured to generate controlled phase differences in the light from the off-axis light beams 109. Light reflected by the mirror array 102 is passed through the optical system 112 and beamsplitters 110, 114 and directed onto target wafer 104.

The illumination source 108 may be any illumination source capable of generating electromagnetic waves sufficient to reflect from the mirror array 102 and to induce chemical changes in a photosensitive layer on the wafer 104. Preferably the illumination source 108 is an intermittent source, capable of exposing the wafer during selected periods of a continuous scan movement of the light beam relative to the wafer. Commonly (but not exclusively), the illumination source 108 is a coherent light source. In one embodiment the illumination source 108 is an ArF excimer laser producing 193 nm (nanometer) output. The optical system 112 is typically a demagnifying projection optical system of a type known to those having ordinary skill in the art. However, many types of optical systems can be implemented. Moreover, the inventors contemplate systems without such optics.

The off axis light 109 from the source 108 is directed onto a mirror array 102 and projected onto the target substrate (here target wafer 104) using, for example, beamsplitters 110, 114 and projection optical system 112. As is known to those of ordinary skill many possible arrangements can facilitate projecting a desired light pattern onto the substrate in accordance with the principles of the invention. In particular, in one alternative configuration the projection optical system 112 can be arranged beween the beamsplitting optic 114 and the wafer 104. Additionally, it is especially pointed out that arrangements having fewer or no beamsplitters can be used.

FIG. 1(b) is a simplified schematic cross section depiction of a portion of an apparatus embodiment depiction of capable of generating off-axis light beams that are directed onto a mirror array in accordance with the principles of the present invention. In particular, a source 120 embodiment is depicted. The beamsplitters (e.g., 110, 114) and demagnification and focusing optics (e.g., 112) have been dispensed with in this depiction to simplify the explanation. A source 120 and included aperture 121 are shown. The source and aperture can be implemented, for example, as 108, 108a of FIG. 1(a). Additionally, a mirror array 126 is configured to generate a phase shift optical pattern. The array can be the programmable array 102 (of FIG. 1(a)) and is positioned so that light from the source diffracts from the array 126. The depicted source/aperture combination are capable of generating off-axis light beams that are directed onto a mirror array in accordance with the principles of the present invention. As previously explained, the source 120 can be implemented as any one of a number of different light sources known to those of ordinary skill. Particular embodiments can include coherent sources like lasers or nearly coherent devices like filtered light sources. In one embodiment, the source 120 can be a 193 nm ArF laser.

The depicted embodiment of the source aperture 121 is configured to generate off axis light beams 122 in accordance with the principles of the invention. Generally such off axis light beams 122 are symmetrically arranged about the axis 124. For purposes of this patent, the axis 124 comprises a line normal to the plane of the mirror array 126. Thus, off axis light beams 122 are directed onto the mirror array 124 at an angle other than normal to the array surface plane. Thus, off axis light is chosen because it accentuates the contribution made by non-zero order light. In fact, when light is directed onto a mirror array configured as a phase shift optical pattern, substantially all of the zero order light is removed from the diffracted signal. This is advantageous because such zero order signals contain no phase dependent information. Thus, the resultant diffracted signal 128 is comprised almost entirely of first order light and higher order light which is rich in interference patterns generated by the phase shift mirror array. In general, optical systems having a σ in the range of about 0.50 to 0.90 are particularly well suited to this invention. Additionally, the inventors point out that many other σ values can be used to generate suitable off axis light beams. σ values can be optimized to accommodate the pitch of the wafer pattern in accordance with known principles such as illustrated in the following equation:

$$NA*\sigma=\lambda/2p$$

where NA reference to the numerical aperture of the optical system; where p= wafer pitch; and where σ= an aperture value for an aperture of the optical system (e.g., a center aperture); and where λ= the wavelength of the exposing light beam.

For example, if the pattern to be formed on the wafer has a pattern pitch of 180 nm (i.e., the pitch of an alternating pattern of light and dark regions, for example, a series of 60 nm wide dark lines separated by 120 nm wide "bright" spaces or alternatively a series of 90 nm dark lines separated by 90 nm "bright" spaces, and so on), the above equation can be used to determine the necessary σ values. In one example, using a pitch of p=180 nm (e.g., a 60 nm line with a 120 nm space), NA=0.70, and a λ=193 nm then a suitable σ value is determined by (193/(2*180*0.70)=0.77. This can be used as the center σ value. In order to obtain sufficient optical strength in the light beam a sufficient gap must be formed between inner and outer σ values. In one example, an inner annular σ=0.62 can be selected along with an outer σ value=0.92. In general, inner and outer σ values can range from about 0.5 to about 0.9, but as is known to those having ordinary skill in the art, other values can be implemented.

FIG. 1(c) illustrates a face on view of one aperture embodiment suitable for implementing the principles of the present invention. The aperture 130 is configured to generate an annular off axis beam pattern suitable for directing onto a mirror array configured to implement a phase shift optical pattern. The annular aperture 130 is configured having a blocking center portion 131 that defines the inner radius $R_i$ for the annular off axis beam pattern. Also, the annular aperture 130 is configured having an outer blocking portion 132 that defines the outer radius $R_o$ for the annular off axis beam pattern. Such an annular aperture is well suited to providing a set of equally distributed off axis light beams 122 in accordance with the principles of the present invention. In one particular embodiment, using for example a 193 nm source and a 0.70 NA optical system, an inner radius having a σ value of about 0.51 and an outer radius having a σ of about 0.85 are satisfactory. In the depicted embodiment, the outer radius of the outer blocking portion 132 has a σ value of 1. As is known to those of ordinary skill, other σ values can be used to optimize other systems.

Additionally, the inventors contemplate various other aperture configurations that can produce satisfactory results in accordance with the principles of the invention. For example, a quadrapole aperture can be used. FIG. 1(d) depicts one embodiment of such a quadrapole aperture 140 embodiment. Four openings 141 are used to pass off axis light through the aperture 140. In the depicted embodiment the openings 141 are symmetric in configuration. A related approach using a "quasar" aperture can also be used. In one common implementation known to those having ordinary skill in the art a quadrapole quasar aperture is an annular aperture broken up onto four separate segments.

In another embodiment, depicted in FIG. 1(e), an octopole implementation can be used. Eight openings 151 are used to pass off axis light through the aperture 150. Again, the openings 151 can be symmetrically arranged about the aperture. The inventors note that any number of openings could be used to generate the desired off axis light beams. Even a single off axis aperture (i.e., a single aperture displace from a centerline) or a dipole aperture could be used. Also, the inventors point out that the openings need not be circular. Other shapes and sizes can be used to practice the invention. Additionally, the apertures can be configured so that the light roll off pattern is abrupt (e.g., normal) or alternatively a more gradual intensity increase can be employed (e.g., a Gaussian intensity roll off). One of the difficulties with such off axis illumination when applied to "large" open areas (i.e., areas having pitch distances of greater than on the order of the wavelength of the exposing light) is the previously mentioned drift problem. Also, periodic optical patterns of diffracted light also can extend into regions that are intended to be dark. These difficulties can be corrected by configuring the mirror array to generate an optical pattern that corrects for said line width drift. This is done by configuring the array to produce "assist features" that are formed using the mirrors of the mirror array in accordance with descriptions provided below. The assist features are added to reduce the intensity of the unwanted bands of light. For example, the periodic bands of light in the "dark regions" can be reduced to an intensity level below the threshold of light required to convert the photoimageable material on a substrate surface. Such photoimageable materials are alternatively referred to as photosensitive materials. One commonly used family of such materials are photoresist materials. The threshold level of light exposure required to convert such photoresist materials is well known to those of ordinary skill. For purposes of this patent "convert" means cause a light induced reaction in a photosensitive material such that the material becomes easily removable in accordance with standard photoresist developing techniques. Alternatively, "convert" can mean cause a light induced reaction in a photosensitive material such that the material undergoes a reaction that makes the exposed photoresist difficult to remove. Both such processes are well known in the photolithographic arts.

FIG. 2 is a simplified schematic graph diagram illustrating aspects of the line width drift problem. When a system is optimized for a pitch of, for example, 130 nm (e.g., a line pitch of 130 nm), projected images corresponding to a line width of 60 nm can be easily maintained. However, as depicted, when the line pitch of the pattern becomes wider, the line width for the "60 nm wide" line begins to drift from the intended value. For example, FIG. 2 depicts line width (201) as a function of line pitch (202). As indicated here, as the line pitch broadens the resulting line width becomes considerably narrower. For example, for a system optimized for line pitch at, for example, 130 nm, at line pitches below 180 nm there is, as expected, fairly accurate reproduction of the line width at the desired 60 nm width. However, as the line pitch widens the line width drifts. For example, at a pitch of about 320 nm, a corresponding line width of 30 nm is produced by the pattern (see, 205). Heretofore, this phenomenon has lead to serious manufacturing difficulties when dense patterns (e.g., narrow pitches) and less dense patterns are formed on the same layer. Consequently, there is a need for a method for correcting this drift. Accordingly, the inventors have provided a means for correcting this drift. The mirror array is configured to include assist features (also referred to as corrective features) that reduce the effect of this line width drift.

Also, due to the nature of off axis illumination, a periodic "banding" pattern of light and dark regions will extend into the regions between the dark lines (i.e., the regions that define the pitch density). In order to address this problem, an optical pattern that corrects for said line width drift is generated (e.g., assist features) to cause the patterns to appear "pseudo-dense" by causing a series of light bands which preserve the diffraction pattern but are of "sub-resolution intensity". As used herein, sub-resolution intensity means that the bands of light are present, but that the intensity of the bands is so low that they are beneath the conversion threshold for the photoimageable materials onto which they are projected. This means that although the light pattern is projected onto a region between the lines (regions that have intentionally bright bands of light), the intensity is so reduced that it does not react the photosensitive material.

Thus, some embodiments of the invention make use of a mirror array configured to generate a phase shift optical image pattern having a background bright pattern (defining a bright region fully exposed); a pattern of dark lines (defining unexposed regions); and a pattern of "gray lines" generated by assist features and having an intermediate exposure intensity below the threshold of the photoimageable material. For example, the background pattern can be configured to generate a relatively intense exposure pattern sufficient to activate the photoimageable layer formed on the target substrate. In contrast, the pattern of dark lines can be generated by configuring an associated portion of the mirror array to generate a relatively intense destructive interference pattern generating a pattern of dark lines by not activating the associated portions of the photoimageable layer. Additionally, a portion of the mirror array is configured to generate a pattern of "gray lines" that demonstrate an intermittent light pattern having a light intensity insufficient to activate the photoimageable layer formed on the target substrate. Thus, although a phase shift light pattern is produced having dark features (i.e., the so-called gray lines) in an area that is not desirable to convert, the faintness of the gray line optical signal is such that the pattern does not transfer to the photoimageable layer. Of course for alternative photoresist types, the light intensities are reversed. Thus, a mirror array configured with assist features enables an apparatus having optical settings (e.g., focus and dose) optimized for the smallest CD to be used to faithfully transfer image features having much larger critical dimensions without the need for additional exposures. Moreover, these assist features permit proximity correction and correct the effects of line width drift. Details of this aspect of the invention are explained in greater detail herein.

FIG. 3 schematically illustrates one embodiment of a mirror array 300 suitable for use as mirror array 102 of FIG. 1. The depicted mirror array 300 is depicted as a piston mirror implementation arranged in a neutral position, in accordance with one embodiment of the present invention. That is, the mirror array 300 illustrates one configuration of individual mirrors 302. The individual mirrors 302 are shown in a coplanar position with the plane of the mirror array 300, thus reflecting incident light back in a direction normal to the plane of the individual mirrors 302 (as well as the plane of the mirror array 300). In such a configuration, the incident light is reflected and directed to the corresponding pixel of the wafer 104. Accordingly, with the use of a positive photoresist layer on the wafer 104, the exposed region will be converted and dissolved away (on the photoresist layer) for subsequent etching operations. With the use of a negative photoresist layer on the wafer 104, the exposed region will be converted and left in place (on the photoresist layer) for subsequent etching operations. It is to be understood that this neutral position may be achieved by supplying suitable electrostatic potentials to electrodes corresponding to the individual mirrors as known to those of skill in the relevant arts. With the use of a positive photoresist, in order to form a line in the wafer, the mirrors require an adjustment in position such that an absence of light (a dark line) appears on the selected portion of the photosensitive resist on the wafer, thus allowing the resist in the selected area to subsequently remain behind after development followed by etching using the patterned resist layer. Generally, dark areas correspond to a light pattern having complete destructive interference. As is readily apparent to those of ordinary skill, alternative photoresists change the effects of light and dark to generate a desired photoresist pattern after a development process. In one embodiment, the mirrors are formed of aluminum or silicon with a top layer formed of aluminum. However, any suitably stiff and/or reflective materials can be employed.

The present invention, in various embodiments, may be configured to direct light to a substrate such as a wafer by tilting the mirrors or arranging the individual mirrors in piston-displaced positions or by using a combination of tilting and piston displacement of the mirror surfaces.

FIGS. 4-7 illustrate some example configurations for the mirror array in order to introduce phase differences into the direct write printing process and thus to effectuate printing of features. While illustrative, these configurations are not intended to limit the scope of the present invention.

As previously explained, embodiments of the invention have been constructed that can expose substrates using a phase shift pattern in a single exposure. In order to achieve such patterns, the mirror array is configured to generate a background pattern (of light or dark) and a line pattern (of dark or light lines (the opposite of the background)) augmented by a pattern of assist features ("gray lines") formed at various points in the pattern. In an embodiment that defines line patterns by exposing the photoresist to light, the pattern of assist features forms a sub-resolution light pattern (gray lines) that has an intensity below the exposure threshold of the photoimageable material used to transfer a pattern to a substrate.

FIG. 4(a) is a plan view of a portion of a mirror array 400 configured to generate a strong phase shift pattern in accordance with the principles of the invention. The embodiment depicted in FIG. 4(a) schematically depicts a mirror array configuration capable of generating strong phase shift optical pattern having a line pitch 404 of 180 nm and a line width 402 of about 60 nm using a 193 nm source. The mirrors are, for example, demagnified to achieve pixelization of about 30 nm×30 nm when projected onto a substrate surface. The depicted pattern can be extended upward 411 and downward 412 to construct long lines. Additionally, the number of lines can be increased by extending the pattern to the left and right repetitively until the desired line pattern is formed. The mirror array 400 is configured to include a background pattern of mirrors 401 arranged to have zero phase. These mirrors are adjacent to another set of mirrors 403 which are configured to generate a phase difference of 180 degrees relative to the background pattern of (zero phase) mirrors 401. Thus, the mirrors create destructive interferences at the interface between the zero phase mirrors and the 180 degree phase mirrors 403 to generate a dark line about 60 nm wide. Alternatively, because all that is important is relative phase, the mirrors 401 can be set at 180 degrees phase and mirrors 403 can be set at zero phase.

FIG. 4(b) schematically depicts a side view of the piston mirror implementation of the depicted embodiment. It is noted that mirrors 403 were displaced downward 180° (i.e., −180°) relative to the zero phase mirrors 401 but could just as easily been displaced upward 180°. Also, other configurations could readily be applied.

However, as the line pitch is increased the line width of the features produced begin to change. This phenomenon is in part dependent of exposure source wavelength and the diffractive effects of other portions of the mask. Thus, different degrees of correction are generally required for different exposure wavelengths. That being stated, the following examples will be discussed with respect to a 193 nm exposure source. The invention is, however, not so limited.

For a 193 nm source, drift from an ideal phase shift optical pattern begins to distort the fidelity of the phase shift pattern at line pitches of greater than in the range of about 110 nm to about 150 nm. This is dependent of course on a number of factors including, but are not limited to, the NA of the system and the σ of the source aperture. This problem can be quite severe. For example, in a system optimized for a CD of about 60 nm, if a portion of the pattern has a line pitch of above 320 nm the resultant line distortions will cause a 60 nm wide line to print as a line having a width of about 25 nm. Correction of this problem is needed.

In the example provided by FIGS. 5(a) and 5(b) a line pitch 505 of 240 nm is offered as an example. With reference to FIG. 2 it can be seen that for a 240 nm line pitch, the line width drifts from the intended 60 nm to about 50 nm. This can be corrected by adjusting the mirror array to produce an assist feature. Here such a feature is introduced by adjusting the phase of feature mirrors 506. So the mirror array 500 is configured to include a background pattern of mirrors 501 at zero phase. These mirrors are adjacent to another set of mirrors 503 which are configured to generate a phase difference of 180 degrees relative to the background pattern of mirrors 501. These mirrors 503 are used to define 60 nm wide lines. Mirrors create destructive interferences at the interface between the zero phase mirrors 501 and the 180 degree phase mirrors 503 to generate a dark line about 60 nm wide. Alternatively, because all that is important is relative phase, the mirrors 501 can be set at 180 degrees phase and mirrors 503 can be set at zero phase. However, because the line pitch has been extended to 240 nm, line width drift has been introduced that will make the line produced by mirrors 501 too narrow. This is corrected by adjusting the phase of alignment feature mirrors 506. Here these mirrors are set at about 57 degrees phase relative to, for example, the mirrors 503. Additionally, small phase adjustments can be made to the mirrors 506 to further fine tune the position and width of lines produced by the array 500. Generally, the alignment feature mirrors 506 are set in the range of about 50-140 degrees relative to the adjacent mirrors.

In another example, FIGS. 6(a) and 6(b) depict a portion of a mirror configuration designed to correct aberrations in a line pitch of 900 nm. Additional, identically configured, portions of the mirror array can extend in repeating patterns to the right and to the left of the depicted portion. Thus, in the depicted embodiment, for a 900 nm line pitch, five assist features 606 can be used for each line 603. As before line width drift correction is implemented to return the intended line width to about 60 nm. Here, several of the patterns are adjusted by adjusting the phase of assist feature mirrors 606. As before, the mirror array 600 is configured to include a background pattern of mirrors 601 at zero phase (here accomplished by three mirror wide groups 601). In the middle of the pattern is a set of mirrors 603 configured to generate the line. This set of mirrors 603 is configured to generate a phase difference of 180 degrees relative to the background pattern of mirrors 601. Again the line defining mirrors 603 are set to define 60 nm wide lines. Again, as before, because all that is important is relative phase, the mirrors 601 can be set at 180 degrees phase and mirrors 603 can be set at zero phase. However, because the line pitch has been extended to 900 nm, a large amount of line width drift has been introduced that will make the line produced by mirrors 601 too narrow. This is corrected by introducing a correction using mirrors 606 (here five sets) to generate assist features and adjusting the phase of these mirrors 606. Here, in the depicted embodiment, these mirrors 606 are set at about 74 degrees phase relative to, for example, the mirrors 603. As before, small phase adjustments can be made to the mirrors 606 to further fine tune the position and width of lines produced by the array 600. Generally, the mirrors 606 that form the assist features are set in the range of about 50-140 degrees relative to the adjacent mirrors.

The degree of phase adjustment for the correction feature generating mirrors is graphically depicted in FIG. 7. The depicted relationship describes the amount of phase difference (for the correction feature generating mirrors relative to the background pattern mirrors (e.g., zero phase difference) required to maintain a 60 nm line at 60 nm for each line pitch. For example, at line pitch of 240 nm, the phase difference for the correction feature generating mirrors is about 57 degrees (relative to the background zero phase). Also, at line pitch of 300 nm, the phase difference for the correction feature generating mirrors is about 62 degrees (additionally, in some embodiments, the array is configured to generate one assist feature per line), for a line pitch of 420 nm, the phase difference for the correction feature generating mirrors is about 78 degrees (additionally, in some embodiments, the array is configured to generate two assist features per line), for a line pitch of 540 nm, the phase difference for the correction feature generating mirrors is about 80 degrees (additionally, in some embodiments, the array is configured to generate two assist features per line), at line pitch of 900 nm, the phase difference for the correction feature generating mirrors is about 74 degrees (additionally, in some embodiments, the array is configured to generate five assist features per line), and so on.

The foregoing systems and methods use programmable optical mirrors in a maskless lithography system to form desired optical patterns on a substrate. Such systems can make use of a number of different programmable mirror arrays. For example, the described maskless direct-write lithography system can use mirrors configured to operate in a piston-displacement ("piston") mode; a cantilevered (i.e., hinged at one end) mode, a torsional (center twisting) mode having a quarter wavelength plate on a portion of the mirror or capable of operating in one or more modes at the same time. A scanning apparatus can be used to expose various portions of a substrate to a pattern produced by the optical portions of the system (in those cases where an entire substrate is not exposed at one time). By using the proposed inventive system, light from a source may be modulated by combining the phases from the mirrors in a customized fashion to form the desired pattern. The individual mirrors are controlled to implement the above-referenced phase shift patterning techniques.

The present invention uses an array of mirrors that introduce phase differences into an optical signal which is projected onto a target substrate to form an image pattern that is used to establish patterning of a photosensitive layer formed on the substrate. In some embodiments the mirrors are programmable (i.e., the mirrors can be actuated using a controller) allowing the system to individually (or collectively) orient mirrors to introduce a light path difference (i.e., across the mirrors) resulting in a phase difference that enhances contrast in a resultant image. Moreover, such phase differences can be used to generate light regions (which expose the target to relatively bright light intensity calculated to expose a photoimageable layer (i.e., a photoresist)) and dark regions (generally due to destructive interference patterns) calculated to form dark lines by not exposing the photoimageable layer. Also, in embodiments of the present invention, intermittent patterns of lower intensity light are used to enhance the process window of the system. These so-called "gray-line" features and their use have been described herein.

Referring back to the mirror array 102 illustrated in FIG. 1(a) preferably comprises a plurality of mirrors. The individual mirrors preferably capable of a piston mode, a tilting mode (which includes tilting about a center axis in a cantelivered mode or tilting about a mirror edge in a hinged mode), or some combination of tilt and piston displacement operation. Additionally, mirrors operating in a "cantilevered" mode, a piston mode, an edge tilting mode or some combination can include a mirror wherein a portion of the mirror includes a quarter wavelength plate configured to be highly transmissive at the wavelength of light used by the source 108. In the tilting, piston, and cantilevered mode, each individual mirror is controlled by electrostatic voltages applied to electrodes to control the degree of tilt or piston motion in an analog fashion. The actual tilting or piston motion of the individual mirror may be constrained to several degrees of movement in either direction from the neutral "flat" position by the physical configuration of the mirrors and the mirror array.

As explained above, a mirror array (e.g., 102, 126) is implemented to practice the invention. Typically, each of the individual mirrors in the mirror array is responsive to control signals provided to orient the mirrors. Additionally, each of the mirrors can be programmably actuated using, for example, a mirror array control element. Referring, for example, to FIG. 1(a), such a control element 115 can use software to actuate the individual mirrors of the array 102 to produce a desired optical pattern which is then projected onto a target substrate (here wafer 104) to produce a desired image. As alluded to above, the off axis light 109 from the illumination source 108 may be directed to the photosensitive wafer 104 by any suitable means as known to those of skill in the relevant art. In accordance with one embodiment, the mirror array 102 comprises a plurality of mirrors, each of the plurality of mirrors having a very small size. For example, mirrors having sides on the order of about 8 μm (micron) can be used. The inventors specifically point out that other sizes of mirrors can be used. For example, Micronic Laser Systems produces a 16 μm×16 μm mirror array that could be used to implement aspects of the invention. Such mirrors can be demagnified to any final pixel size. In one embodiment, a final pixel size of about 27-30 nm on a side (at the image plane e.g., on the photosensitive layer of the wafer 104) is employed. Such demagnification can be accomplished using a number of lens elements 112 such as known to those having ordinary skill in the art. Preferably, such demagnification is accomplished so that each of the plurality of mirrors corresponds to a pixel imaged on the wafer. Although the apparatus illustrated is a catioptric configuration, the scope of the invention is not so limited. That is, any configuration which allows the use of mirror arrays to direct light to a substrate is expected to be suitable and thus within the scope of the invention.

Reference to FIGS. 8(a)-8(e) schematically illustrate modes of operation of each of the three mirror embodiment types. In each of the depicted embodiments the top surfaces are reflective. FIG. 8(a) illustrates the mode of operation for a "cantilevered" embodiment. The mirror 810 is tilted about an edge 811 (in the direction indicated by the arrow) to displace the mirror a distance such that light reflected by the displaced mirror has a different phase that light reflected by other mirrors in the array (e.g., undeflected mirrors). FIGS. 8(b) and 8(d) illustrate the mode of operation for a quarter wavelength tilt mirror embodiment. The mirror 820 is rotated about a center post 823 as indicated. The mirror 820 includes a quarter wavelength thick transmissive plate 821 formed over a portion of the mirror surface. As illustrated in FIG. 8(d), the transmissive plate 821 is made so that it is about one quarter of a wavelength 822 (of the exposing light) thick. This means that if the source is a 193 nm wavelength laser, that transmissive plate is at least partially transmissive at 193 nm and about one quarter of the wavelength (193 nm) thick. The actual thickness is chosen as one quarter of a wavelength because light incident of the plate 821 penetrates about one quarter of a wavelength into the plate 821 where it is reflected by the mirror 820 surface and travels another one quarter of a wavelength back to the surface. At this point the light is 180 degrees out of phase with the light reflected by the other (un-plated) portions of the mirror 820 generating a destructive phase interference pattern. Thus, as is known to those having ordinary skill in the art, depending on the materials chosen and the light wavelengths used, the quarter wavelength plate 821 is configured to generate destructive interference relative to light incident on the mirror 820 and not passing through the plate 821. FIG. 8(d) schematically depicts two adjacent mirrors being tilted in accordance with an embodiment of the invention. The tilting is done to displace the mirror edges a distance such that light reflected by the displaced mirror has a different phase that light reflected by other mirrors in the array (e.g., adjacent mirrors).

Finally, FIGS. 8(c) and 8(e) schematically illustrate a piston type mirror embodiment. Such piston mirrors 830 can be elevated or depressed such that the mirror faces remain substantially parallel to each other regardless of the degree of elevation or depression. By carefully selecting the degree of elevation or depression of the mirrors, a mirror array can create any number of interference patterns relative to adjacent mirrors (or mirrors some distance away).

The movement of these mirrors is sufficient to alter the phase of the light reflected by the mirrors (also referred to herein as the mirror phase) such that adjacent mirrors can be configured to provide controlled interference and accordingly vary the amount of light reaching the photosensitive region of the wafer. This results in enhanced contrast. It should be noted that for illustrative purposes the configuration and use of the mirror array are described in the context of a system applying a pattern to a photosensitive region of the wafer. However, the invention scope is not so limited. The scope of the invention is intended to extend to transfer of patterns to any photosensitive layer, for example to include the formation of patterns on photo masks or reticles.

Additionally, the inventors teach that an alternating pattern of mirror displacement arranged so that each mirror is 180 degrees out of phase with each adjacent mirror is effective for creating destructive interferences that can be used to create large dark regions. On example of such a pattern is disclosed in the plan view of a portion of a mirror array embodiment 800 depicted in FIG. 8(f). The light mirrors 801 a configured to diffract light so that it is 180 degrees out of phase with light from the dark mirrors 802.

Structures and operational use of tilted and mirror arrays are known in the art and thus further detail here is deemed unnecessary. For example, the use of piston and tilted mirrors is described in "Optical Analysis of Mirror-Based Pattern Generation" by Y. Shroff, Yijian Chen, and W. G. Oldham; Proceedings of SPIE, Vol. 5037 (2003), the entire disclosure of which is incorporated herein by reference for all purposes.

As a further example, integrated circuits comprising microelectronic mirror devices are available commercially.

For example, Texas instruments, Inc. of Dallas, Tex. produces a Digital Micromirror Device (DMD) comprising an array of microscopically small square mirrors, each mirror corresponding to a pixel in the projected image.

Additionally, piston mirror implementations are described in the U.S. patent application Ser. No. 10/825,342, entitled: "Optimized Mirror Design for Optical Direct Write", filed on Apr. 14, 2004 previously incorporated by reference for all purposes. And also described in the U.S. patent application, entitled: "Process And Apparatus For Generating A Strong Phase Shift Optical Pattern For Use In An Optical Direct Write Lithography Process", filed on 18 Nov. 2004 previously incorporated by reference for all purposes.

Additionally, certain complications can arise when different line widths are to be printed on the same substrate. In one instance this arises when a system optimized for one line width has other lines characterized by a different width formed on the same layer. For example, if the optical settings are optimized for lines 60 nm wide with a pitch width of 180 nm, but a number of other wider lines are also needed on the same layer. This can be accommodated by making certain adjustments to the phase pattern used to print the lines. For example, a series of "assist features" can be introduced to into the pattern to enable the pattern to be printed with the necessary fidelity. The problem is that the principles of the invention depend on off-axis phase edge interference where you have 100% transmission bright background at (for example) 0 degrees, and 100% transmission features at (for example) 180 degree phase. In other words, a field of mirrors is configured to reflect light at 0 degrees and a field of mirrors is configured to reflect light 180 degrees out of phase from the 0 degree mirrors. The regions where the 0 degree phased light and the 180 degree phased light touch each other produce phase interference that results in the formation of a dark line. But as the width of the 0 and 180 degree regions widen with increasing CD (e.g., as when one moves perpendicular to the phase interference interface), the interference effect of one phase on another decreases. Consequently, the overall light intensity rises and accordingly the CD cannot be maintained without lowering the dose. This has the effect of fusing together the smaller CD lines. To make wider lines using the same process conditions, two (or more) phase interference features (hence more phase generating interfaces) are used. Additionally, the features that generate the phase interfaces of the patterns are separated by some distance to maximize the effective width of the interference pattern. For example, if the system is optimized for features 60 nm wide and lines 240 nm wide are also desired, a second, third, and fourth, set of interfaces can be provided. Each of the interfaces work together to generate a resultant pattern that creates, for example, a broader "dark" region. In one example, the sets of interfaces can be spaced at intervals of about 60 nm apart to generate a pattern that appears as if it were a single "line" of about 240 nm wide.

Additionally, where wide dark areas are desired checkerboard phase interference patterns can be employed. See, for example, FIG. 8(f). Also, where small dark areas are used next to wide areas of bright intensity (as might be used to print a series of widely separated lines using a positive photoresist) the bright areas can be populated by a number of periodically spaced assist features that result in periodically spaced apart regions of lower light intensity. As depicted in FIG. 8(g), these areas are configured to reflect a lower light intensity, but not sufficiently low so as to affect the solubility of the photoresist. This can be done by for example by introducing a phase shift at the intermediate features that alters the phase to some intermediate value other than 0 or 180 degrees. For example, the mirrors can be adjusted so that they reflect light at a phase value in the range of about 45 degrees to about 135 degrees. FIG. 8(g) provides a schematically depicted light profile of one example implementation. The diagram 850 is a schematic depiction of light dose (I) over distance (d). In the depicted example a positive photoresist is used (although similar principles can be applied to negative photoresists). The exposure threshold 851 depicts the exposure level required to make the resist soluble. Exposure levels below the threshold result in the photoresist being insoluble. The depicted diagram illustrates an exposure pattern used to generate a pattern of dark lines separate by a large bright area in accordance with the principles of the invention. Strong phase interference is generated in regions 852, 853 resulting in dark lines. To facilitate the formation of the large "bright" region 854 between the dark lines, assist features are used. A less pronounced phase interference is generated in regions 855, 856 by the assist features. For example, a phase difference of 90 degrees might be introduced. This will reduce the light intensity in the regions associated with the resultant interference pattern producing "gray lines". However, the reduction in intensity is not so great as to cause the photoresist to remain in place during development. Thus, the feature remains but the light intensity is reduced to a sub-resolution level (i.e., the gray lines do not form a pattern feature in the developed photoresist layer). Thus, the phase pattern remains constant but the relative light intensity is not constant resulting in a highly controllable and predictable pattern having a high degree of fidelity and image sharpness.

FIG. 9 is a flow chart illustrating operations in performing direct write optical lithography using mirror arrays, in accordance with one embodiment of the present invention. The process commences in operation 902 with the configuration of the array. By appropriately controlling the array and the stage, in a one-pass operation, the selected features of the pattern may be created using the configured mirrors of the array. In one implementation, the mirrors are configured through the implementation of software which individually (or in groups) configures the mirrors.

Next, in operation 904, the sample (e.g., wafer) is illuminated using the configured array. In one embodiment a continuous scan is performed with the exposure for each configuration of the array occurring during a short interval of the entire interval that the wafer is aligned with the corresponding mirror array. Once the illumination is completed, the process ends at operation 912.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a pattern on a substrate, the method comprising:

provdiing a target substrate having formed thereon a photoimageable layer;

providing a mirror array comprising a plurality of movable mirrors that can be configured to generate a phase shift optical image pattern;

configuring the mirror array to generate a single phase shift optical image pattern having a background pattern; a line pattern; and an assist feature pattern;

illuminating the mirror array with off-axis light that is directed onto the mirror array from an angle other than normal to a plane of the mirror away to generate said single phase shift optical image pattern producing the background pattern, the line pattern, and the assist feature pattern and wherein the off-axis light is comprised of substantially of non-zero order light; and exposing the target substrate to said phase shift optical image pattern to transfer a desired exposure pattern onto the photoimageable layer.

2. The method of claim 1 wherein configuring the mirror array to generate a phase shift optical image pattern having said background pattern; said line pattern; and said assist feature pattern further comprises:

configuring the mirror array to generate the background pattern so that the background pattern comprises an background pattern optical signal having a light intensity above an exposure intensity required to convert the photoimageable layer;

configuring the mirror array to generate the line pattern so that the line pattern comprises a line pattern optical signal having a light intensity below the exposure intensity required to convert the photoimageable layer; and configuring the mirror array to generate the assist feature pattern so that the assist feature pattern comprises an optical signal having a light intensity above the exposure intensity required to convert the photoimageable layer and below the light intensity of the background pattern optical signal.

3. The method of claim 1 wherein configuring the mirror array to generate a phase shift optical image pattern having said background pattern; said line pattern; and said assist feature pattern further comprises:

configuring the mirror array to generate the background pattern so that the background pattern comprises an background pattern optical signal having a light intensity below an exposure intensity required to convert the photoimageable layer;

configuring the mirror array to generate the line pattern so that the line pattern comprises a line pattern optical signal having a light intensity above the exposure intensity required to convert the photoimageable layer; and configuring the mirror array to generate the assist feature pattern so that the assist feature pattern comprises an optical signal having a light intensity below the exposure intensity required to convert the photoimageable layer and above the light intensity of the background pattern optical signal.

4. The method of claim 1 wherein illuminating the mirror away with said off-axis light comprises illuminating with a light signal comprised substantially of first order light.

5. The method of claim 1 wherein illuminating the mirror away with said off-axis light is performed by illuminating the mirror array with an annular light beam.

6. The method of claim 1 wherein illuminating the mirror away with said off-axis light is performed by illuminating the mirror array with a light beam passed through a single off-axis aperture.

7. The method of claim 1 wherein illuminating the mirror away with said off-axis light is performed by illuminating the mirror array with a light beam produced by one of a quadrapole aperture, a quadrapole quasar aperture, and an octopole aperture.

8. The method of claim 1 wherein providing a mirror array comprising a plurality of movable mirrors includes providing a mirror array having a plurality of movable piston mirrors that can operate to generate a phase shift optical image pattern.

9. The method of claim 1 wherein providing a mirror array comprising a plurality of movable mirrors includes providing a mirror array having a plurality of movable cantilevered mirrors that can operate to generate a phase shift optical image pattern.

10. The method of claim 1 wherein providing a mirror array comprising a plurality of movable mirrors includes providing a mirror array having a plurality of movable tilt mirrors having a quarter wavelength optical plate formed on a portion of each tilt mirror and wherein said mirror array can operate to generate a phase shift optical image pattern.

11. The method of claim 1 wherein configuring the mirror array includes:

configuring the mirror array to generate the background pattern by arranging the mirror array such that mirrors producing the background pattern have substantially no phase difference relative to adjacent mirrors;

configuring the mirror array to produce the line pattern by arranging a first group of mirrors to produce a phase difference of about 180 degrees relative to an adjacent second group of mirrors; and configuring the mirror array to generate the assist feature pattern by configuring the mirror array such that one group of mirrors is oriented to produce a phase difference of in the range of about 70 degrees to about 90 degrees relative to an another adjacent group of mirrors.

12. The method of claim 11 wherein configuring the mirror array to produce the line pattern is achieved by arranging a checkerboard pattern of mirrors wherein each mirror in the pattern is arranged to produce a phase difference of about 180 degrees relative to an adjacent mirror in the checkerboard pattern.

13. The method recited in claim 1 wherein configuring the mirror array comprises configuring the mirror array to simultaneously generate a phase shift optical image pattern having the background pattern; the line pattern; and the assist feature pattern such that the assist feature pattern corrects line width drift in the line pattern but wherein the assist feature pattern is of such an intensity that the assist feature pattern does not transfer onto the photoimageable layer during said exposing of the target substrate.

14. A maskless lithography system comprising:

a mirror array comprising a plurality of movable mirrors configured in an arrangement enabling a single exposure generation of exposure features including at least one of a line feature, an assist feature, and background in a phase shift optical image pattern;

an illumination source configured for directing a light beam comprised of substantially of non-zero order light along an off axis optical path that is not perpendicular to the mirror array such that the off axis light illuminates the mirror array to generate said phase shift optical image pattern that is projected directly onto a wafer or mask substrate; and a control element for configuring the plurality of mirrors in a desired arrangement capable of generating the phase shift optical image pattern.

15. The maskless lithography system of claim 14 wherein the control element configures the plurality of mirrors to generate a phase shift optical image pattern having exposure features that include sub-resolution assist features.

16. The maskless lithography system of claim 14 wherein the mirror array is configured to generate a phase shift optical image pattern having:
- a pattern of mirrors configured to generate constructive interference;
- a pattern of mirrors configured to generate destructive interference; and
- a pattern of mirrors configured to generate an optical pattern that corrects for line width drift.

17. The maskless lithography system of claim 14 wherein the illumination source is configured to generate substantially coherent light.

18. The maskless lithography system of claim 17 wherein the illumination source comprises a laser.

19. The maskless lithography system of claim 18 wherein the laser produces light having a wavelength of 193 nanometers.

20. The maskless lithography system of claim 18 wherein the laser produces light having a wavelength selected from among of 157 nanometers, 193 nanometers, and 248 nanometers.

21. The maskless lithography system of claim 14 further including a stage configured to move the target substrate to facilitate exposure of different portions of the substrate to the phase shift optical image pattern.

22. The maskless lithography system of claim 14 wherein the mirror array comprises a plurality of movable piston mirrors that can operate to generate a phase shift optical image pattern.

23. The maskless lithography system of claim 14 wherein the mirror array comprises a plurality of movable cantilevered mirrors that can operate to generate a phase shift optical image pattern.

24. The maskless lithography system of claim 14 wherein the mirror array comprises a plurality of movable tilt mirrors having a quarter wavelength optical plate formed on a portion of each tilt mirror and wherein such array of mirrors can operate to generate a phase shift optical image pattern.

25. The maskless lithography system of claim 14 wherein the illumination source includes a source aperture configured to direct the light along the off-axis optical path to generate said phase shift optical image pattern.

26. The maskless lithography system of claim 14 wherein the light directed along the off axis optical path comprises substantially first order light.

27. The maskless lithography system of claim 25 wherein the source aperture includes a quadrapole aperture having four openings for generating off-axis light that is directed along the off-axis optical path onto the mirror array to generate said phase shift optical image pattern.

28. The maskless lithography system of claim 25 wherein the source aperture includes an octopole aperture having eight openings for generating off-axis light that is directed along the off-axis optical path onto the mirror array to generate said phase shift optical image pattern.

29. The maskless lithography system of claim 25 wherein the source aperture is configured to generate an annular light beam off-axis light that is directed along the off-axis optical path onto the mirror array to generate said phase shift optical image pattern.

30. The maskless lithography system of claim 14 wherein the mirror array is configured to generate a phase shift optical image pattern in a positive photoresist, the pattern having:
- a pattern of dark lines having exposure intensities such that the optical energy provided by the dark lines is below an exposure threshold for a photoimageable material formed on the target substrate;
- a background pattern of light having an optical energy above the exposure threshold for the photoimageable material formed on the target substrate; and
- a pattern of gray lines having exposure intensities that are greater than those of the pattern of dark lines but are such that the optical energy provided by the gray lines is above the exposure threshold for the photoimageable material formed on the target substrate wherein said pattern of gray lines are generated by assist features of the mirror array.

31. The maskless lithography system of claim 30
wherein the pattern of dark lines is formed by configuring the mirror array to generate a phase difference in a resultant light pattern of about 180 degrees in the portions of the mirror array corresponding to the pattern of dark lines;
wherein the background pattern is formed by configuring the mirror array to generate a phase difference in a resultant light pattern of about 0 degrees in the portions of the mirror array corresponding to the background pattern; and
wherein the pattern of gray lines is formed by configuring the mirror array to generate a phase difference in a resultant light pattern of in the range of about 40 degrees to about 90 degrees in the portions of the mirror array corresponding to the pattern of gray lines.

32. The maskless lithography system of claim 31 wherein the pattern of gray lines is formed by configuring the mirror array to generate a phase difference in a resultant light pattern of about 90 degrees in the portions of the mirror array corresponding to the pattern of gray lines.

33. The maskless lithography system of claim 30 wherein the pattern of dark lines is formed by configuring the mirror array such that a first group of mirrors is oriented to produce a phase difference of about 180 degrees relative to an adjacent second group of mirrors;
wherein the background pattern of light is formed by configuring the mirror array such that mirrors producing the background pattern have substantially no phase difference relative to adjacent mirrors; and
wherein the pattern of gray lines is formed by configuring the mirror array such that one group of mirrors is oriented to produce a phase difference of in the range of about 40 degrees to about 90 degrees relative to an another adjacent group of mirrors.

34. The maskless lithography system of claim 33 wherein the pattern of gray lines is formed by configuring the mirror array such that said one group of mirrors is oriented to produce a phase difference of about 90 degrees relative to said another adjacent group of mirrors.

35. The maskless lithography system of claim 25 wherein the mirror array is configured to generate a phase shift optical image pattern having:
- a pattern of dark lines having exposure intensities such that the optical energy provided by the dark lines is below an exposure threshold for a photoimageable material formed on the target substrate;
- a background pattern of light having an optical energy above the exposure threshold for the photoimageable material formed on the target substrate; and
- a pattern of gray lines having exposure intensities that are greater than those of the pattern of dark lines but are such that the optical energy provided by the gray lines is below the exposure threshold for the photoimageable material formed on the target substrate.

36. The maskless lithography system of claim 35
wherein the pattern of dark lines is formed by configuring the mirror array to generate a phase difference in a resultant light pattern of about 180 degrees in the portions of the mirror array corresponding to the pattern of dark lines;

wherein the background pattern is formed by configuring the mirror array to generate a phase difference in a resultant light pattern of about 0 degrees in the portions of the mirror array corresponding to the background pattern; and wherein the pattern of gray lines is formed by configuring the mirror array to generate a phase difference in a resultant light pattern of in the range of about 40 degrees to about 90 degrees in the portions of the mirror array corresponding to the pattern of gray lines.

37. The maskless lithography system of claim 36 wherein the pattern of gray lines is formed by configuring the mirror array to generate a phase difference in a resultant light pattern of about 90 degrees in the portions of the mirror array corresponding to the pattern of gray lines.

38. The maskless lithography system of claim 25 wherein the pattern of dark lines is formed by configuring the mirror array such that a first group of mirrors is oriented to produce a phase difference of about 180 degrees relative to an adjacent second group of mirrors;

wherein the background pattern of light is formed by configuring the mirror array such that mirrors producing the background pattern have substantially no phase difference relative to adjacent mirrors; and wherein the pattern of gray lines is formed by configuring the mirror array such that one group of mirrors is oriented to produce a phase difference of in the range of about 40 degrees to about 90 degrees relative to an another adjacent group of mirrors.

39. The maskless lithography system of claim 38 wherein the pattern of gray lines is formed by configuring the mirror array such that said one group of mirrors is oriented to produce a phase difference of about 90 degrees relative to said another adjacent group of mirrors.

40. A maskless lithography system comprising:
a mirror array comprising a plurality of movable mirrors that can operate to generate a phase shift optical image pattern;
an illumination source configured for directing light along an off axis optical path that is not perpendicular to the mirror array such that the off axis light illuminates the mirror array to generate said phase shift optical image pattern that is projected directly onto a target substrate such that using identical process conditions the phase shift optical pattern includes a background pattern, a dark image pattern, and a gray image pattern such that under said identical process conditions:
an optical energy below an exposure threshold for a photoimageable material formed on the target substrate is obtained to generate the dark image pattern;
an optical energy above the exposure threshold for the photoimageable material formed on the target substrate is obtained to generate the background image pattern; and
an optical energy above the exposure threshold for the photoimageable material, but below the optical energy used to obtain the dark pattern, is obtained to generate the gray image pattern, wherein said gray image pattern is generated by assist features configured into the pattern defined by the mirror array; and
a control element capable of configuring the plurality of mirrors in a desired arrangement capable of generating the phase shift optical image pattern.

41. A method of forming a pattern on a substrate, the method comprising:
providing a target substrate having formed thereon a photoimageable layer;
providing a mirror array comprising a plurality of movable mirrors that can be configured to generate a phase shift optical image pattern;
configuring the mirror array so that it enables the simultaneous generation of a single phase shift optical image pattern that includes a background pattern; a line pattern; and a sub-resolution assist feature pattern;
illuminating the mirror array with substantially non-zero order light directed onto the mirror array from an angle other than normal to a plane of the mirror array to generate a single exposure phase shift optical image pattern that includes said background pattern; said line pattern; and an un-printed sub-resolution assist feature pattern; and
exposing the target substrate to said phase shift optical image pattern to transfer a desired exposure pattern onto the photoimageable layer.

* * * * *